US 6,624,679 B2

(12) United States Patent
Tomaiuolo et al.

(10) Patent No.: US 6,624,679 B2
(45) Date of Patent: Sep. 23, 2003

(54) STABILIZED DELAY CIRCUIT

(75) Inventors: Francesco Tomaiuolo, Monte Sant'Angelo (IT); Fabrizio Campanale, Bari (IT); Salvatore Nicosia, Palermo (IT); Luca Giuseppe De Ambroggi, Catania (IT); Promod Kumar, Motta S. Anastasia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 43 days.

(21) Appl. No.: 09/773,269

(22) Filed: Jan. 31, 2001

(65) Prior Publication Data

US 2002/0135413 A1 Sep. 26, 2002

(30) Foreign Application Priority Data

Jan. 31, 2000 (EP) .............................. 00830068
May 17, 2000 (IT) ..................... VA2000A0011

(51) Int. Cl.⁷ .............................................. H03H 11/26
(52) U.S. Cl. ...................................... 327/262; 327/264
(58) Field of Search ................................ 327/262, 261, 327/264, 271, 272, 284, 285, 288, 277

(56) References Cited

U.S. PATENT DOCUMENTS

| | | | |
|---|---|---|---|
| 5,027,053 A | * 6/1991 | Ohri et al. ................. 323/313 |
| 5,559,990 A | 9/1996 | Cheng et al. ............... 395/484 |
| 5,594,391 A | * 1/1997 | Yoshizawa ................... 327/172 |
| 5,596,539 A | 1/1997 | Passow et al. ............... 365/210 |
| 5,610,543 A | * 3/1997 | Chang et al. ................ 327/145 |
| 5,696,917 A | 12/1997 | Mills et al. ................. 395/401 |
| 5,966,724 A | 10/1999 | Ryan .......................... 711/105 |
| 6,018,264 A | * 1/2000 | Jin ............................. 327/536 |
| 6,191,630 B1 | * 2/2001 | Ozawa et al. ............... 327/172 |

FOREIGN PATENT DOCUMENTS

| EP | 0561370 | 9/1993 |
|---|---|---|
| EP | 0961283 | 12/1999 |

* cited by examiner

Primary Examiner—Timothy P. Callahan
Assistant Examiner—Cassandra Cox
(74) Attorney, Agent, or Firm—Lisa K. Jorgenson; Allen, Dyer, Doppelt, Milbrath & Gilchrist, P.A.

(57) ABSTRACT

A delay circuit includes a first inverter connected to a supply voltage, and has an input for receiving an input signal. A delay regulating transistor is connected between the first inverter and a first voltage reference, and has a control terminal for receiving a biasing voltage. A capacitor is connected between an output of the first inverter and the first voltage reference. A second inverter is connected to the output of the first inverter for outputting a delayed output signal. An auxiliary current path is in parallel to the delay regulating transistor for allowing a portion of a discharge current from the capacitor to flow therethrough. The portion of the discharge current is proportional to the supply voltage. The auxiliary current path includes a diode connected to the first inverter, and a second transistor connected between the diode and the first voltage reference. The second transistor has a control terminal for receiving the biasing voltage.

26 Claims, 6 Drawing Sheets

STABILIZED DELAY CIRCUIT

FIELD OF THE INVENTION

The present invention relates to integrated circuits, and, in particular, to a delay circuit for delaying an input signal that is practically independent from the supply voltage.

BACKGROUND OF THE INVENTION

Delay circuits are essential elements in monostable pulse generators, and are widely used in devices such as synchronous memory devices. Simple delay circuits may be obtained using a chain of capacitors and inverters, which are influenced by variations of the supply voltage and temperature.

A known architecture that solves in part these problems of precision is depicted in FIG. 1. The depicted architecture is substantially formed by two inverters in cascade and a capacitor C. The function of the capacitor C is to increase the capacitive load of the first inverter for modulating the switching delay of the second (output) inverter.

Along the discharge path of the capacitor C there is a transistor M1 that, depending on whether it is in a full or partial conduction state, modifies the total resistance of the discharge path, and thus the decay time of the voltage on the capacitor C. Such a transistor M1 is kept in a conduction state by a constant reference voltage $V_{REF}$ obtained by a common band-gap circuit, for example, which is independent from the temperature.

The drawback of known delay circuits is that the delay is influenced by eventual variations of the supply voltage $V_{DD}$. The capacitor C is charged at the voltage $V_{DD}$ and is discharged at a rate determined by the current $I_{SC}$ that flows in the transistor M1. The current $I_{SC}$ is constant because the transistor M1 is biased with a constant voltage $V_{REF}$. Thus, the discharge time is directly proportional to the supply voltage $V_{DD}$.

The delay with which the output signal $V_{OUT}$ is produced with respect to the input signal $V_{INPUT}$ is affected by a variation of the supply voltage, regardless of the cause. In devices that use delay circuits to produce pulses of a pre-established duration, any variation of the introduced delay produces a variation of the duration of the output pulse. This is a problem that is particularly felt when the generation of pulses of a precisely pre-established and stable duration must be assured under all conditions of operation. This is the case for synchronous memory devices, for example, in which any variability of the duration of pulses would limit performance at high frequencies.

There is a clear need for a delay circuit that, differently from known delay circuits, produces an output signal $V_{OUT}$ that is delayed with respect to the input signal $V_{INPUT}$ by a time interval that is substantially independent from the supply voltage of the circuit.

SUMMARY OF THE INVENTION

In view of the foregoing background, it is an object of the present invention to provide a delay circuit that delays an input signal by a time interval that is practically independent from variations of the supply voltage.

This and other objects, advantages and features are obtained by implementing in parallel to a regulating transistor of the discharge current of a conventional delay circuit another discharge current path that is able to sink a current directly proportional to the supply voltage.

The delay circuit may comprise a first inverter fed with the input signal, a first current terminal of which is coupled to a supply node while a transistor for regulating the delay is connected between the other current terminal of the inverter and a node at a reference voltage (ground). The regulating transistor is kept in a conduction state by a biasing voltage compensated with respect to temperature variations applied to the control terminal of the transistor. A capacitor is connected between the output of the inverter and the node at a reference voltage, and a second (output) inverter is coupled in cascade to the first inverter.

According to the present invention, the delay circuit further comprises an auxiliary current path, in parallel to the regulating transistor, which is formed by a directly biased diode connected to the current terminal of the inverter and by at least another transistor in series to the diode. The transistor is kept in a conduction state by the same biasing voltage applied to the control terminal of the regulating transistor.

The diode may be formed by a transistor of the same conductivity of the other transistor and of the regulating transistor, the control terminal of which is short-circuited to the current terminal that is connected to the current terminal of the inverter. According to a preferred embodiment of the invention the regulating transistor, the second transistor and the diode-connected transistor are n-channel MOS structures.

BRIEF DESCRIPTION OF THE DRAWINGS

The different aspects and advantages of the invention will become even more evident through the description of an embodiment of the invention and by referring to the attached drawings in which.

DETAILED DESCRIPTION OF THE PREFERRED EMBODIMENTS

Figure 2:
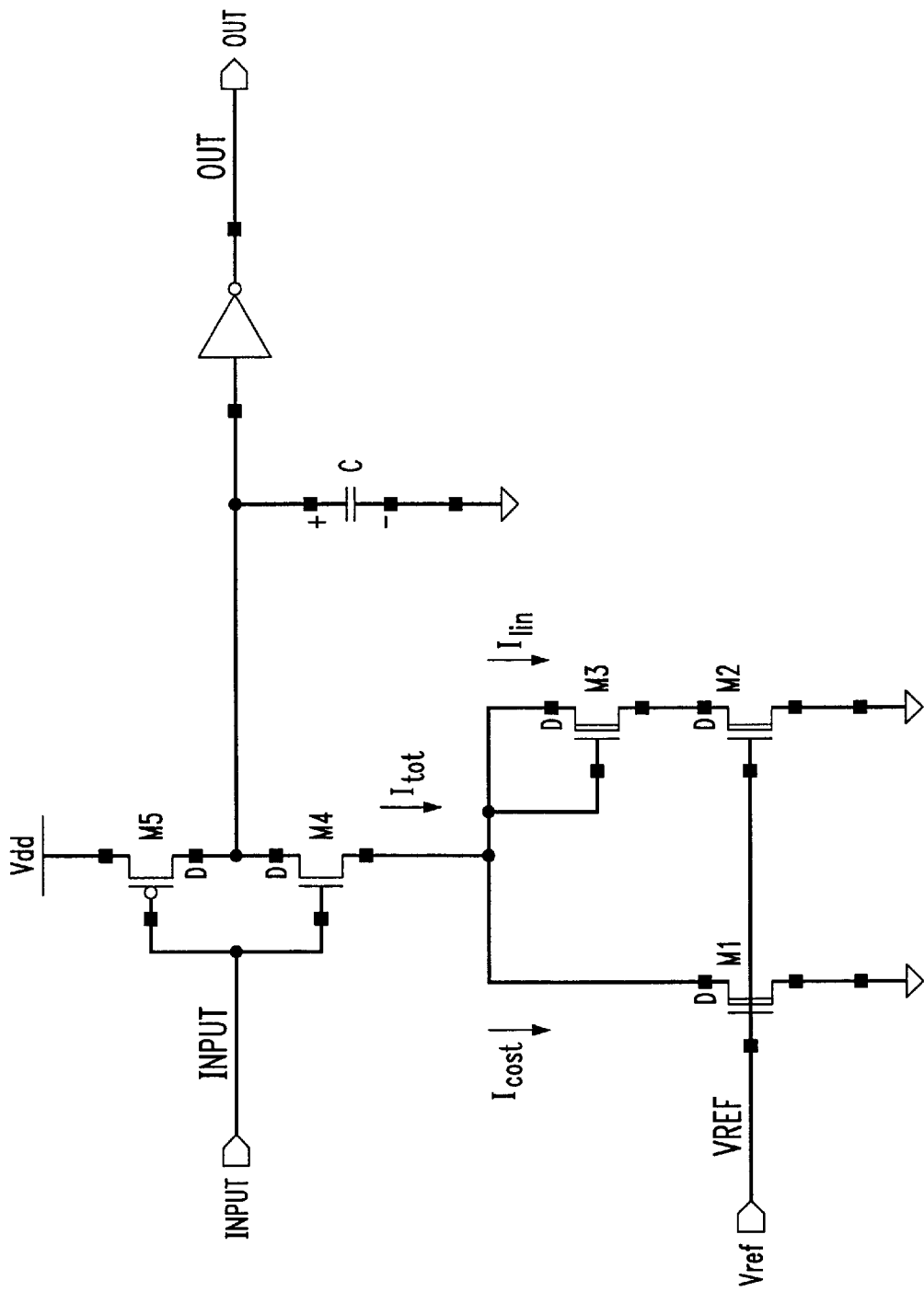
FIG. 2 is a diagram of a delay circuit according to the present invention.

The drawback of the dependence of the delay produced from variations of the supply voltage is effectively overcome by using the circuit of the invention of FIG. 2, in which the discharge of the capacitor C takes place along two distinct current paths in parallel with each other. A first path is present in conventional delay circuits and is formed by a regulating transistor M1. The regulating transistor M1 is biased by a constant, temperature compensated reference voltage $V_{REF}$, and absorbs from the capacitor C a discharge current $I_{COST}$.

The other path is formed by a diode, that as indicated in FIG. 2 may be implemented by a diode-connected transistor M3 that is electrically in series with another transistor M2 that is biased with the same voltage $V_{REF}$. This second path absorbs from the capacitor C a current $I_{LIN}$ that increases as the supply voltage $V_{DD}$ increases. This is because the diode-connected transistor M3 makes the transistor M2 function in the so-called triode zone.

Indicating $V_{DS}2$ as the drain-source voltage on M2, $V_{INPUT}$ as the circuit input voltage, $V_{GS}4$ as the gate-source voltage on M4, and $V_{GS}3$ as the gate-source voltage on M3, the following equation holds $$V_{DS}2=V_{INPUT}-V_{GS}4-V_{GS}3$$

A current $I_{LIN}$ that increases when $V_{DD}$ increases will flow in the transistor M2. This is because the voltage $V_{INPUT}$ is equal to the supply voltage $V_{DD}$ during the discharge of the capacitor C.

Thus when $V_{DD}$ increases, also the initial charge stored in the capacitor C and the total discharge current $I_{LIN}+I_{COST}$ increases. Thus the time that is necessary to make the voltage on the capacitor C reach the switching threshold (that also depends from the supply voltage) of the second inverter remains practically constant. The delay introduced by the circuit does not change when the supply voltage varies.

Figure 3:
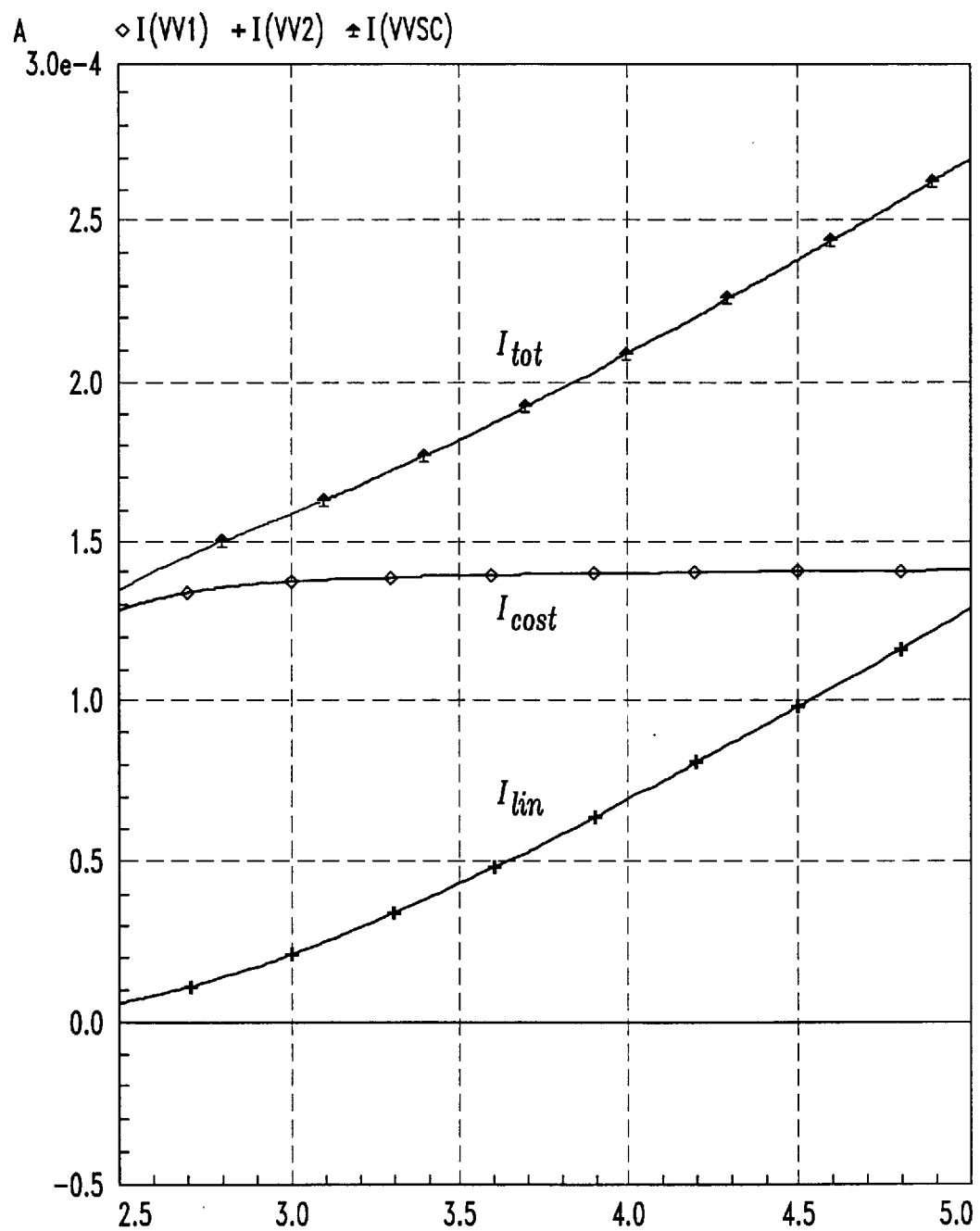
FIG. 3 shows the main current signals of the delay circuit illustrated in FIG. 2 as a function of the supply voltage.
Figure 4:
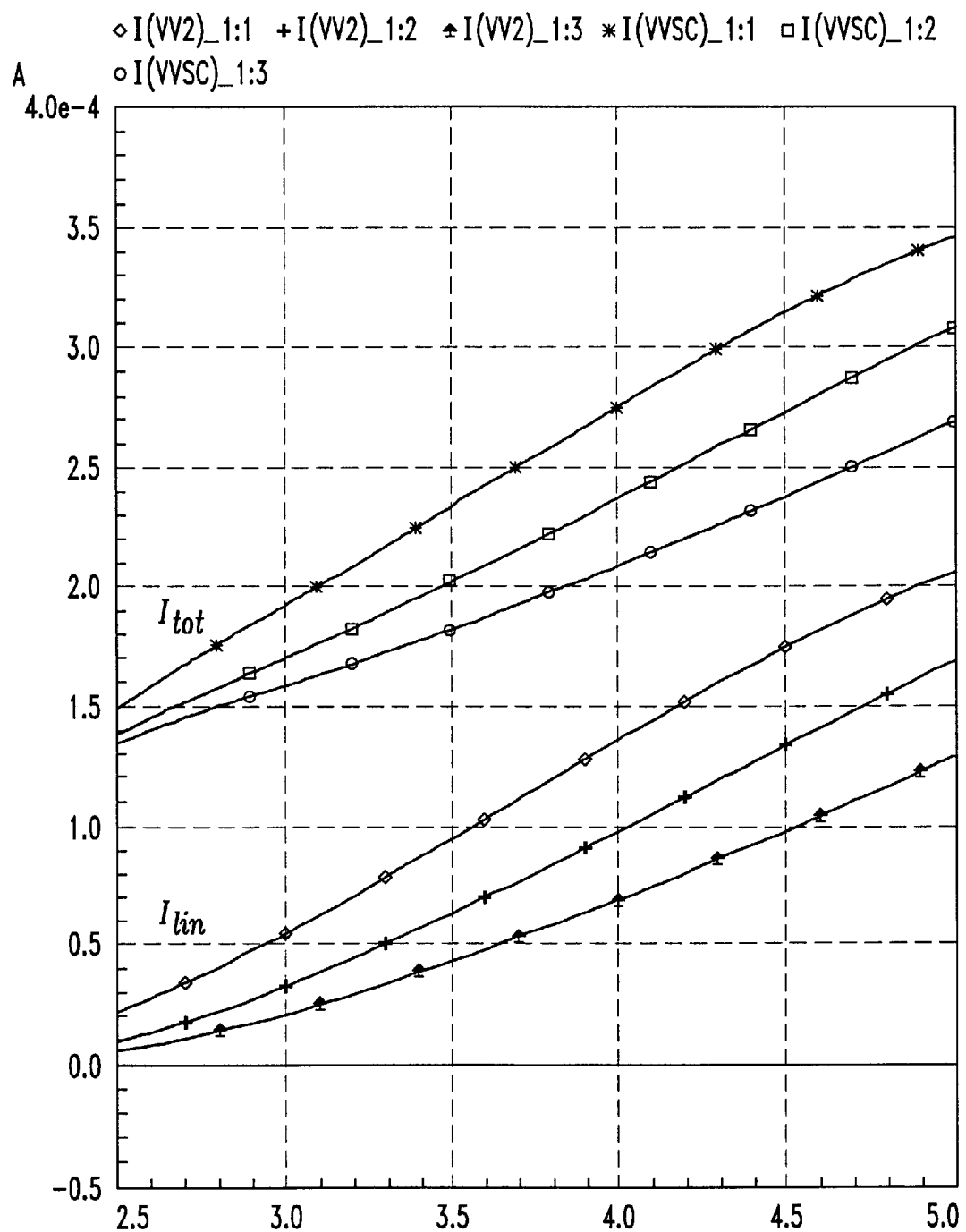
FIG. 4 shows the main current signals of the delay circuit illustrated in FIG. 2 as a function of the supply voltage for different dimensions of the transistors M2 and M3.

The currents circulating in the discharge current paths upon varying the supply voltage $V_{DD}$ are depicted in FIG. 3. By varying the dimensions of the transistors of the second discharge path it is possible to modulate the current $I_{LIN}$, as depicted in FIG. 4, in such a way as to compensate the effect of a possible variation of $V_{DD}$.

Figure 1:
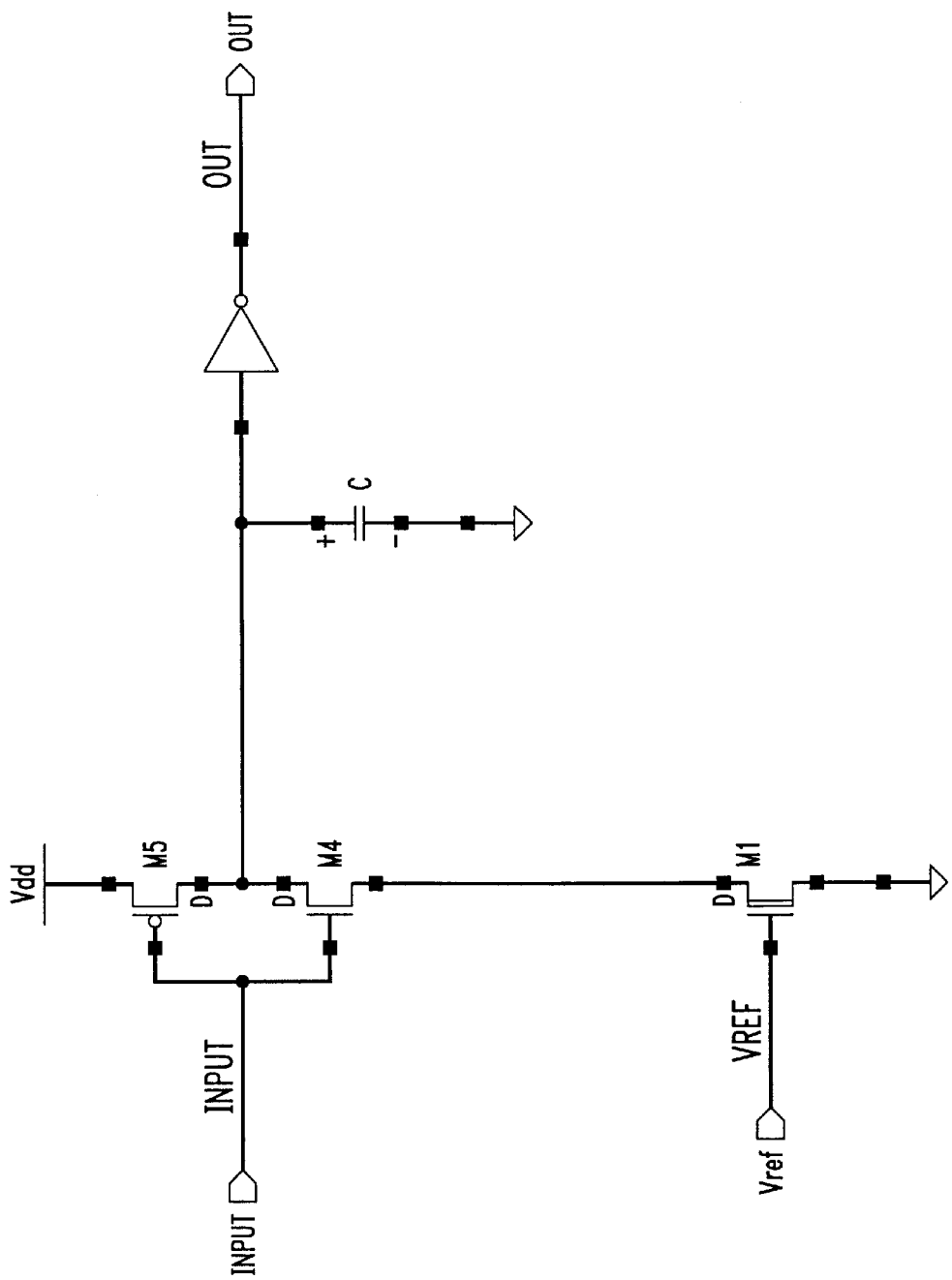
FIG. 1 is a diagram of a common delay circuit according to the prior art.
Figure 5A:
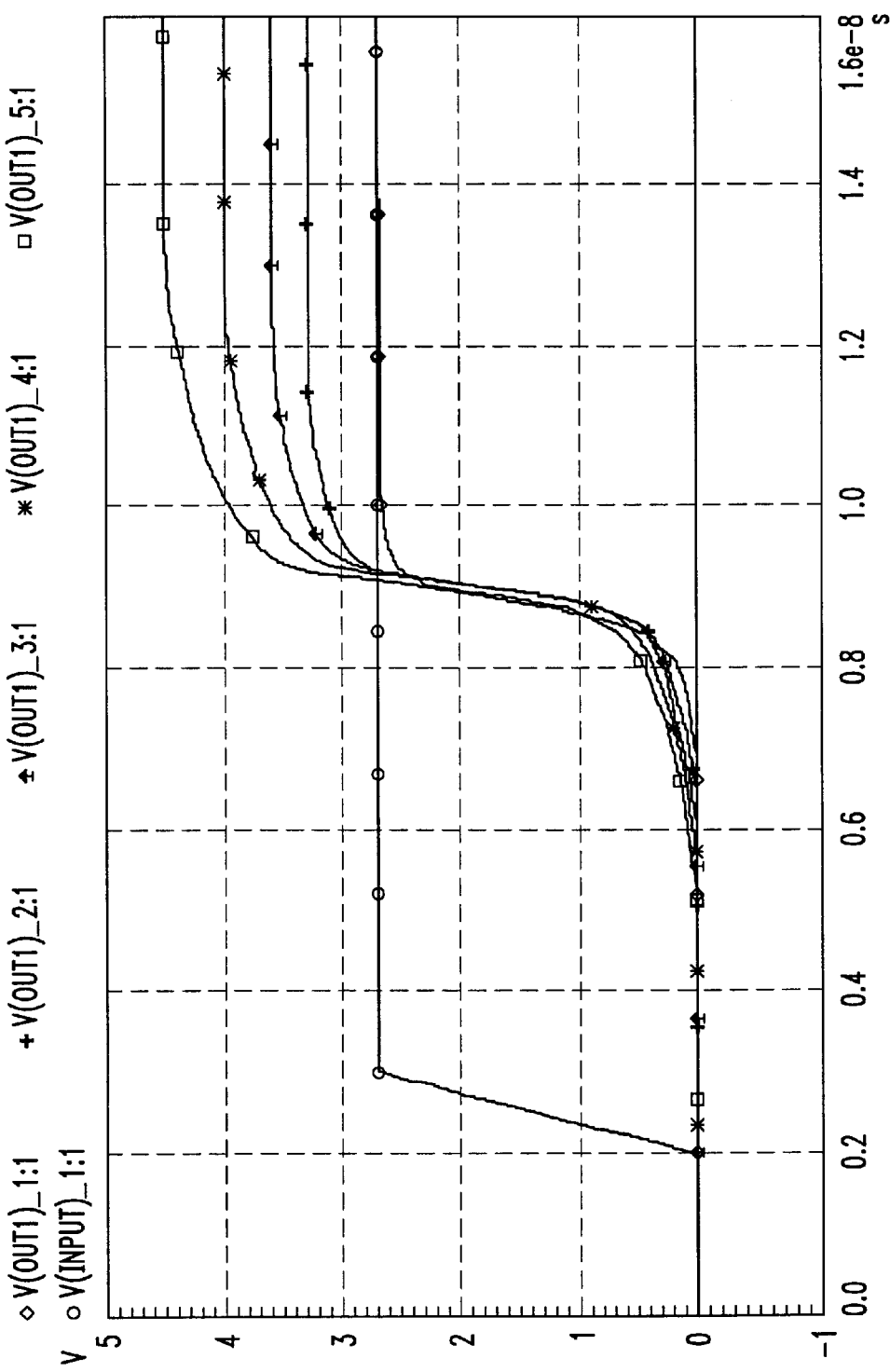
FIG. 5a shows the response of the circuit illustrated in FIG. 2 for different values of the supply voltage.
Figure 5B:
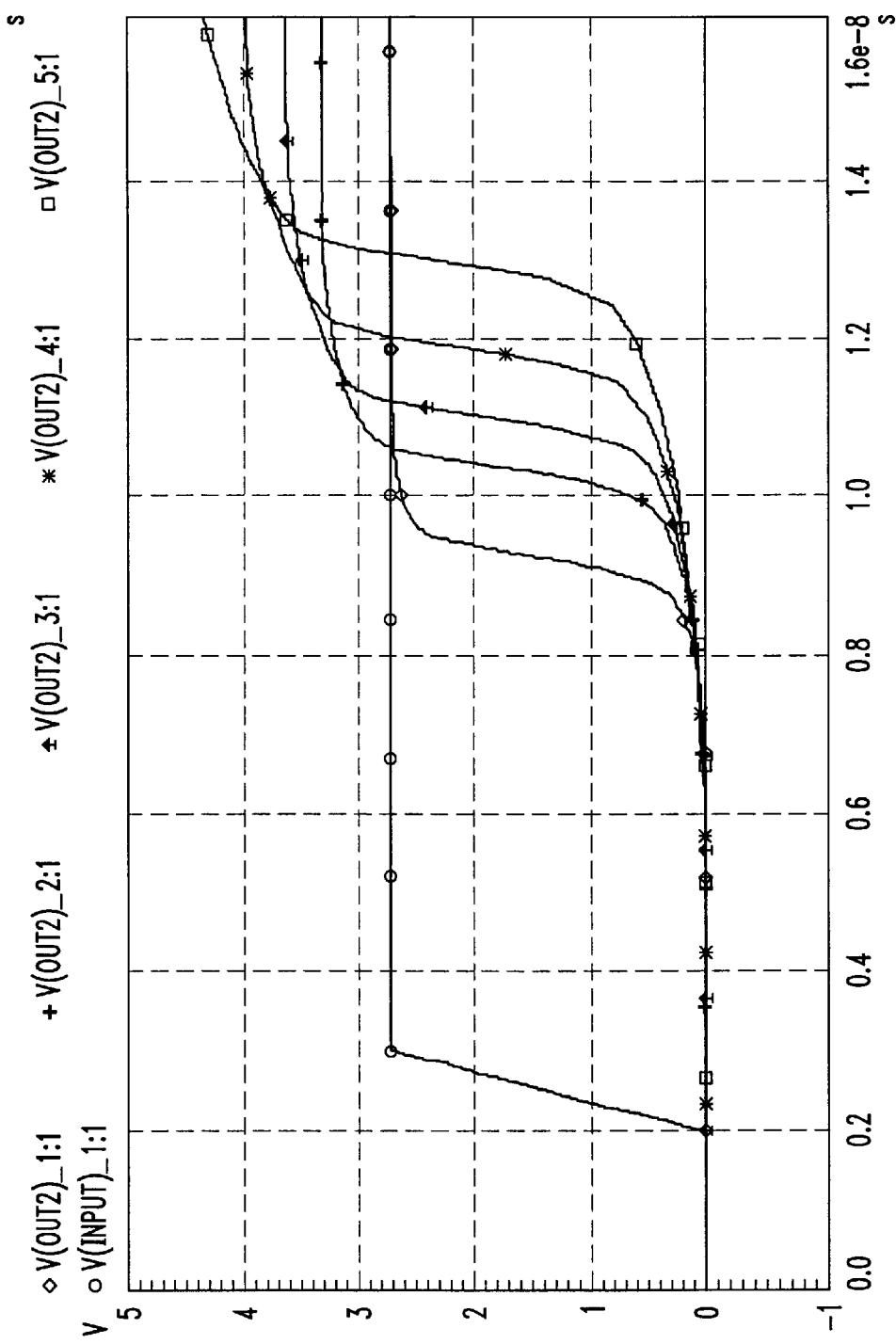
FIG. 5b shows for comparison purposes the response of the delay circuit illustrated in FIG. 1 for different values of the supply voltage.

According to a preferred embodiment of the invention, the transistors M1, M2 and M3 are all natural n-channel MOS transistors. FIGS. 5a and 5b illustrate the responses of the circuit of the invention and of the circuit of FIG. 1, respectively, for different values of the supply voltage $V_{DD}$ between 2.7V and 4.5V. The circuit of the invention produces a delay that is substantially independent from the supply voltage, while the response of the known delay circuit of FIG. 1 shows a strong dependence on $V_{DD}$.

That which is claimed is:

1. A delay circuit comprising:
    a first inverter connected to a supply voltage and having an input for receiving an input signal;
    a delay regulating transistor connected between said first inverter and a first voltage reference, and having control terminal for receiving a biasing voltage;
    a capacitor connected between an output of said first inverter and the first voltage reference;
    at least one second inverter connected to the output of said first inverter for outputting a delayed output signal; and
    an auxiliary current path in parallel with said delay regulating transistor, the auxiliary current path comprising
        a diode connected to said first inverter, and
        at least one second transistor connected between said diode and the first voltage reference, and having a control terminal for receiving the biasing voltage.

2. A delay circuit according to claim 1, wherein the biasing voltage is constant so that said delay regulating transistor and said at least one second transistor remain conducting.

3. A delay circuit according to claim 1, wherein said diode comprises a third transistor configured as a diode.

4. A delay circuit according to claim 3, wherein said third transistor has a same conductivity as said at least one second transistor.

5. A delay circuit according to claim 3, wherein said delay regulating transistor, said at least one second transistor and said third transistor each comprises an N-channel MOS transistor.

6. A delay circuit according to claim 1, wherein a portion of a discharge current from said capacitor flows in the auxiliary current path.

7. A delay circuit according to claim 6, wherein the portion of the discharge current is proportional to the supply voltage.

8. A delay circuit comprising:
    a first inverter connected to a supply voltage and having an input for receiving an input signal;
    a delay regulating transistor connected between said first inverter and a first voltage reference;
    a capacitor connected between an output of said first inverter and the first voltage reference;
    a second inverter connected to the output of said first inverter for outputting a delayed output signal; and
    an auxiliary current path in parallel with said delay regulating transistor for receiving a portion of a discharge current from said capacitor, the auxiliary current path comprising a diode.

9. A delay circuit according to claim 8, wherein the portion of the discharge current is proportional to the supply voltage.

10. A delay circuit according to claim 8, wherein said diode is connected to said first inverter; and wherein the auxiliary current path further comprises a second transistor connected between said diode and the first voltage reference.

11. A delay circuit according to claim 10, wherein said second transistor has a control terminal for receiving a biasing voltage.

12. A delay circuit according to claim 8, wherein said diode comprises a third transistor configured as a diode.

13. A delay circuit according to claim 12, wherein said third transistor has a same conductivity as said second transistor.

14. A delay circuit according to claim 13, wherein said delay regulating transistor, said second transistor and said third transistor each comprises an N-channel MOS transistor.

15. A delay circuit according to claim 8, wherein said delay regulating transistor includes a control terminal for receiving a biasing voltage.

16. A method for delaying an input signal being applied to a first inverter connected to a supply voltage and including a capacitor connected between an output of the first inverter and a first voltage reference, the method comprising:
    applying a biasing voltage to a delay regulating transistor in a first discharge path connected between the first inverter and the first voltage reference; and
    providing an auxiliary current path in parallel with the first discharge path for receiving a portion of a discharge current from the capacitor, the auxiliary current path comprising a diode.

17. A method according to claim 16, wherein the discharge current is proportional to the supply voltage.

18. A method according to claim 16, further comprising outputting a delayed output signal.

19. A method according to claim 16, wherein the diode is connected to the first inverter; and wherein the auxiliary current path further comprises a second transistor connected between the diode and the first voltage reference.

20. A method according to claim 19, further comprising applying the bias voltage to the second transistor.

21. A method according to claim 16, wherein the diode comprises a third transistor configured as a diode.

22. A method for delaying an input signal being applied to a first inverter connected to a supply voltage and including a capacitor connected between an output of the first inverter and a first voltage reference, the method comprising:

applying a biasing voltage to a delay regulating transistor in a first discharge path connected between the first inverter and the first voltage reference; and providing an auxiliary current path in parallel with the first discharge path for receiving a portion of a discharge current from the capacitor, the auxiliary current path comprising a diode connected to the first inverter, and a second transistor connected between the diode and the first voltage reference.

23. A method according to claim 22, wherein the discharge current is proportional to the supply voltage.

24. A method according to claim 22, further comprising outputting a delayed output signal.

25. A method according to claim 22, further comprising applying the bias voltage to the second transistor.

26. A method according to claim 22, wherein the diode comprises a third transistor configured as a diode.

* * * * *